(12) United States Patent
Lin et al.

(10) Patent No.: US 12,501,678 B2
(45) Date of Patent: Dec. 16, 2025

(54) SEMICONDUCTOR DEVICE AND METHOD FOR MANUFACTURING THE SAME

(71) Applicant: UNITED MICROELECTRONICS CORP., Hsinchu (TW)

(72) Inventors: Da-Jun Lin, Kaohsiung (TW); Chih-Tung Yeh, Taoyuan (TW); Fu-Yu Tsai, Tainan (TW); Bin-Siang Tsai, Changhua County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 714 days.

(21) Appl. No.: 17/849,754

(22) Filed: Jun. 27, 2022

(65) Prior Publication Data

US 2023/0326991 A1    Oct. 12, 2023

(30) Foreign Application Priority Data

Apr. 12, 2022    (CN) .......................... 202210378793.5

(51) Int. Cl.
| | | |
|---|---|---|
| *H10D 62/85* | (2025.01) | |
| *H01L 21/285* | (2006.01) | |
| *H01L 23/31* | (2006.01) | |
| *H10D 30/01* | (2025.01) | |
| *H10D 30/47* | (2025.01) | |
| *H10D 62/824* | (2025.01) | |
| *H10D 64/01* | (2025.01) | |
| *H10D 64/23* | (2025.01) | |
| *H10D 64/62* | (2025.01) | |

(52) U.S. Cl.
CPC ....... *H10D 62/85* (2025.01); *H01L 21/28575* (2013.01); *H01L 23/3171* (2013.01); *H10D 30/015* (2025.01); *H10D 30/475* (2025.01); *H10D 62/824* (2025.01); *H10D 62/8503* (2025.01); *H10D 64/01* (2025.01); *H10D 64/256* (2025.01); *H10D 64/62* (2025.01)

(58) Field of Classification Search
CPC .... H10D 62/85; H10D 30/015; H10D 30/475; H10D 62/824; H10D 62/8503; H10D 64/01; H10D 64/256; H10D 64/62; H10D 62/343; H01L 21/28575; H01L 23/3171
See application file for complete search history.

(56) References Cited

U.S. PATENT DOCUMENTS

| | | | |
|---|---|---|---|
| 8,039,872 B2 | 10/2011 | Otake | |
| 8,946,776 B2 | 2/2015 | Green et al. | |
| 9,981,286 B2* | 5/2018 | Woodruff | .......... C23C 16/45525 |
| 10,985,271 B2 | 4/2021 | Yang | |
| 11,081,579 B2 | 8/2021 | Chang et al. | |

(Continued)

OTHER PUBLICATIONS

Office Action issued by Taiwan Intellectual Property Office on Jul. 25, 2025.

*Primary Examiner* — Tan N Tran
(74) *Attorney, Agent, or Firm* — WPAT, PC

(57) ABSTRACT

A semiconductor device and a method for manufacturing the same are provided. The semiconductor device includes a channel layer, a gate element on the channel layer, and source/drain elements at least partly embedded in the channel layer. The source/drain elements are on opposite sides of the gate element. The source/drain elements include a metal element and a lower silicide element between the metal element and the channel layer. The lower silicide element has a hydrogen content less than 2 at %.

17 Claims, 4 Drawing Sheets

(56) References Cited

U.S. PATENT DOCUMENTS

| | | |
|---|---|---|
| 11,239,327 B2 | 2/2022 | Lee et al. |
| 11,264,492 B2 | 3/2022 | Huang et al. |
| 11,296,214 B2 | 4/2022 | Lee et al. |
| 12,262,554 B2 * | 3/2025 | Yeh ..................... H10D 64/251 |
| 2011/0095380 A1 * | 4/2011 | Matsuda ............ H10D 30/0212 |
| | | 257/412 |
| 2017/0077255 A1 * | 3/2017 | Yao ..................... H10D 62/824 |

* cited by examiner

SEMICONDUCTOR DEVICE AND METHOD FOR MANUFACTURING THE SAME

This application claims the benefit of People's Republic of China application Serial No. 202210378793.5, filed Apr. 12, 2022, the subject matter of which is incorporated herein by reference.

BACKGROUND

Technical Field

The disclosure relates to a semiconductor device and a method for manufacturing the same, and more particularly to a semiconductor device including a high electron mobility transistor (HEMT) structure and a method for manufacturing the same.

Description of the Related Art

High electron mobility transistors have been widely used in various applications in recent years. Specifically, the high electron mobility transistors include two-dimensional electron gas (2-DEG) with high electron mobility, making these transistors suitable for various high-speed and high-power electronic components.

However, there are still several important issues unaddressed in the development of high electron mobility transistors. For example, a large contact resistance at the junction of a source/drain element and a channel layer may decrease the electrical performance of the transistors.

It is desirable to provide technology for a semiconductor device with low contact resistance.

SUMMARY

The present disclosure relates to a semiconductor device and a method for manufacturing the same.

According to an embodiment of the present disclosure, a semiconductor device is provided. The semiconductor device includes a channel layer, a gate element on the channel layer, and source/drain elements at least partly embedded in the channel layer. The source/drain elements are on opposite sides of the gate element. The source/drain elements include a metal element and a lower silicide element between the metal element and the channel layer. The lower silicide element has a hydrogen content less than 2 at %.

According to an embodiment of the present disclosure, a semiconductor device is provided. The semiconductor device includes a channel layer, a gate element on the channel layer, and source/drain elements at least partly embedded in the channel layer. The source/drain elements are on opposite sides of the gate element. The source/drain elements include a metal element, an upper silicide element and a lower silicide element. The lower silicide element is between the metal element and the channel layer. The lower silicide element is below the upper silicide element and separated from the upper silicide element.

According to an embodiment of the present disclosure, a semiconductor device is provided. The semiconductor device includes a channel layer, a gate element on the channel layer, and source/drain elements at least partly embedded in the channel layer. The source/drain elements are on opposite sides of the gate element. The source/drain elements include a metal element and a lower silicide element between the metal element and the channel layer. The lower silicide element has a nitrogen content less than 5 at %.

According to an embodiment of the present disclosure, a method for manufacturing a semiconductor device is provided. The method includes: forming a channel layer on a substrate; forming a barrier layer on the channel layer; forming a gate element on the barrier layer; forming a hole through the barrier layer, wherein a bottom of the hole is below an upper surface of the channel layer; forming a source/drain element. The step of forming the source/drain element includes lining the hole with a silicon film having a hydrogen content less than 5 at %, and forming a first metal film and a second metal film on the silicon film. The first metal film and the second metal film include different materials.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
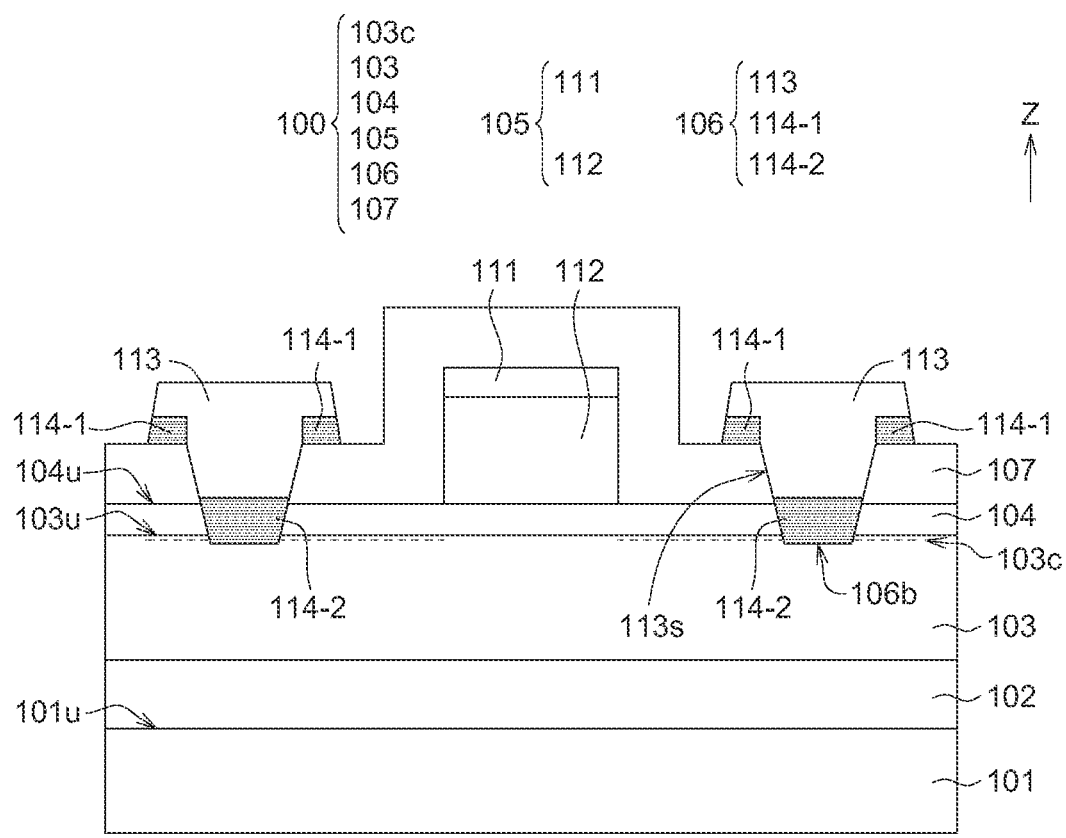
FIG. 1 schematically illustrates a semiconductor device according to an embodiment of the present disclosure.

FIG. 1 schematically illustrates a semiconductor device 10 according to an embodiment of the present disclosure. The semiconductor device 10 includes a substrate 101, a transistor structure 100 disposed on the substrate 101 along a Z direction, and a buffer layer 102 between the substrate 101 and the transistor structure 100. The Z direction may be, for example, a normal direction to an upper surface 101u of the substrate 101.

The transistor structure 100 includes a channel layer 103, a barrier layer 104, a gate element 105, two source/drain elements 106 and a passivation layer 107.

The channel layer 103 is on the buffer layer 102. The gate element 105 is on the channel layer 103. The barrier layer 104 is between the channel layer 103 and the gate element 105. The gate element 105 may include a control layer 112 and a gate metal layer 111 on the control layer 112. The passivation layer 107 may be on the channel layer 103. The passivation layer 107 may cover an upper surface 104u of the barrier layer 104 and the gate element 105.

Two source/drain elements 106 are on opposite sides of the gate element 105. The source/drain elements 106 are on the channel layer 103. Specifically, part of the source/drain element 106 is above the passivation layer 107; another part of the source/drain element 106 passes through the passivation layer 107 and is at least partly embedded in the channel layer 103. In this embodiment, a lower surface 106b of the source/drain element 106 is below an upper surface 103u of the channel layer 103.

The source/drain element 106 includes a metal element 113, at least one upper silicide element 114-1 between the metal element 113 and the passivation layer 107, and at least one lower silicide element 114-2 between the metal element 113 and the channel layer 103. The lower silicide element 114-2 is separated from the upper silicide element 114-1. The lower silicide element 114-2 is below the upper silicide element 114-1. The upper silicide element 114-1 is above the passivation layer 107. In this embodiment, the source/drain element 106 includes two upper silicide elements 114-1 and one lower silicide element 114-2 separated from each other. Two upper silicide elements 114-1 may be approximately at the same level. The metal element 113 has a sidewall 113s between the upper silicide element 114-1 and the lower silicide element 114-2. The sidewall 113s of the metal element 113 may directly contact the passivation layer 107.

The transistor structure 100 may further include a carrier channel 103c (represented by lateral dashed lines in FIG. 1). The carrier channel 103c may be formed near an interface between the channel layer 103 and the barrier layer 104. The carrier channel 103c may be also known as two-dimensional electron gas (2-DEG). For example, the transistor structure 100 may be a high electron mobility transistor structure.

Figure 2:
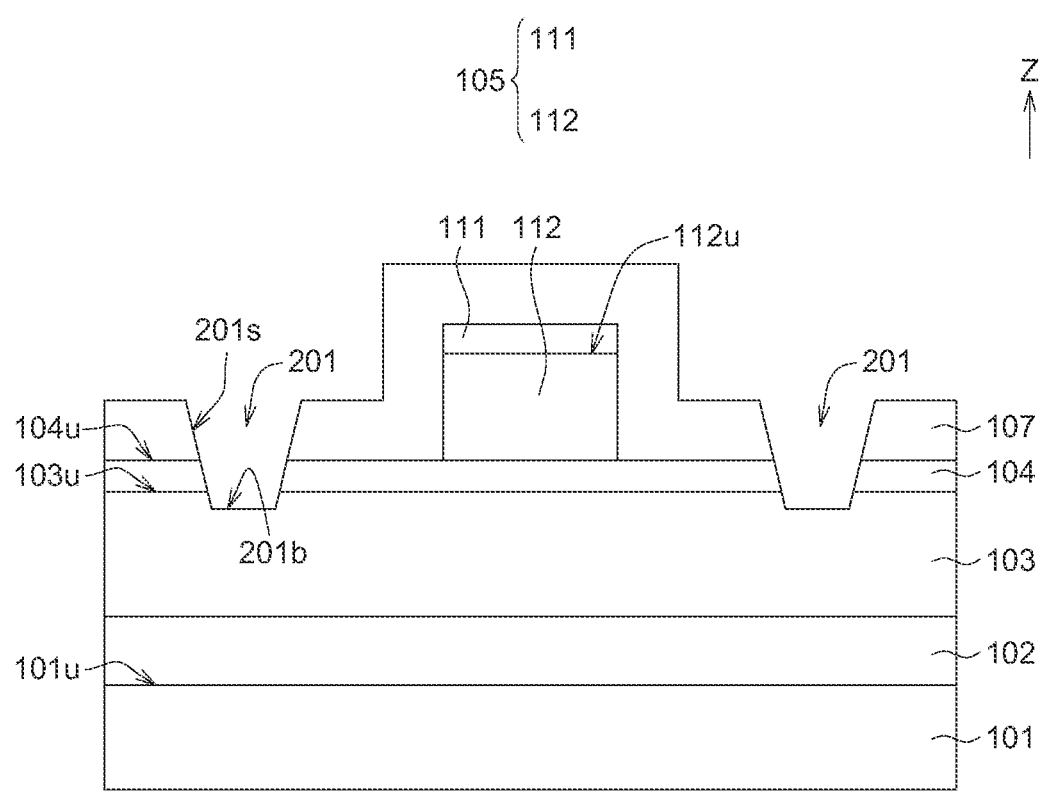
FIGS. 2-4 schematically illustrate a method for manufacturing a semiconductor device according to an embodiment of the present disclosure.
Figure 3:
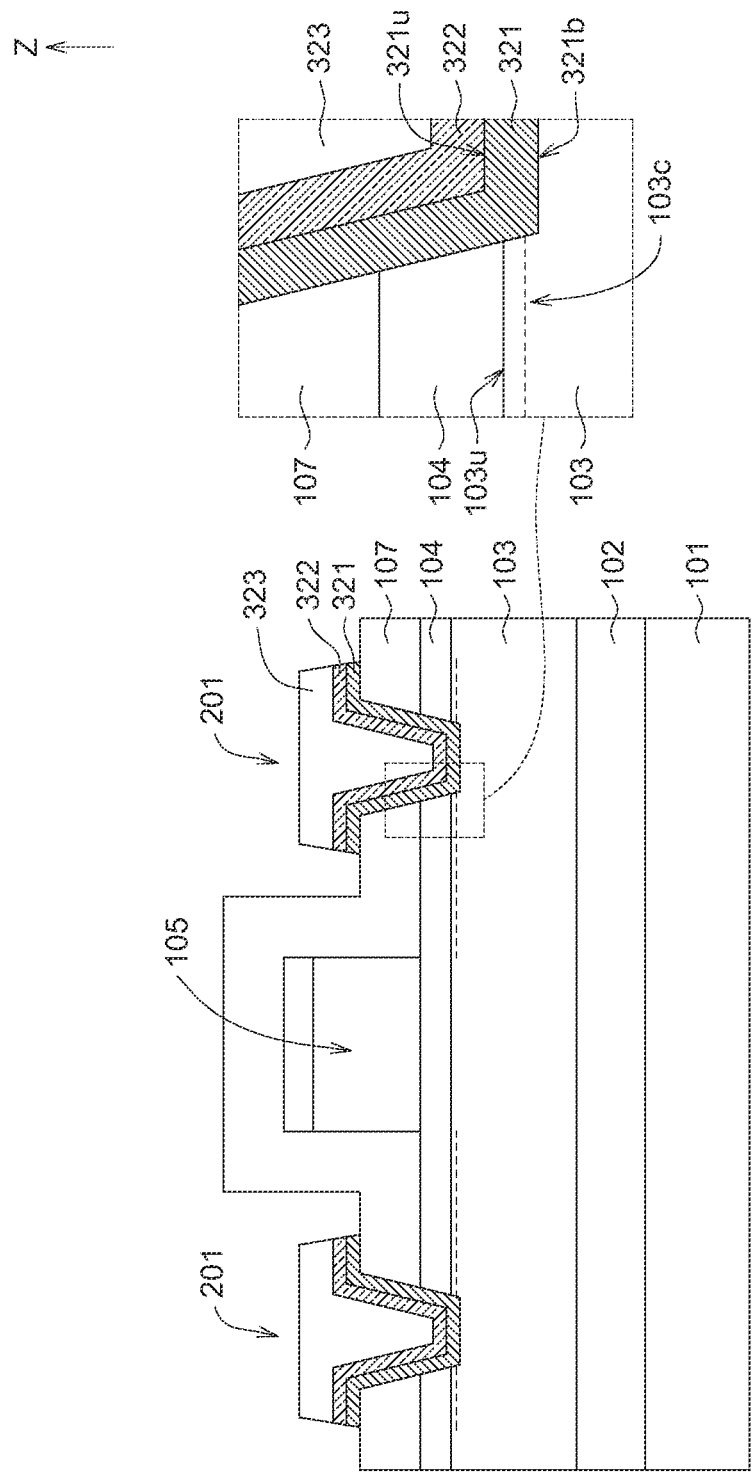
Figure 4:
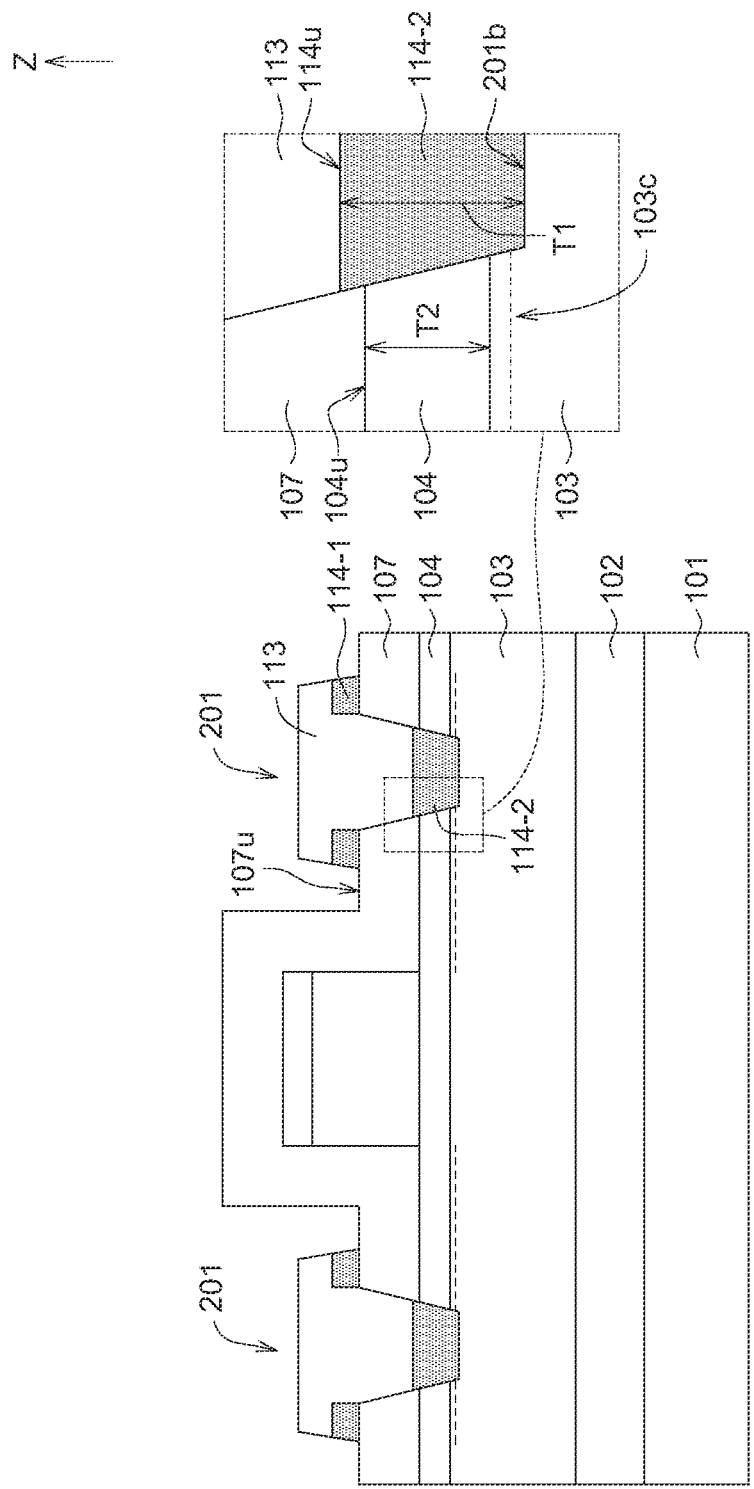

FIGS. 2-4 schematically illustrate a method for manufacturing a semiconductor device according to an embodiment of the present disclosure.

Referring to FIG. 2, a substrate 101 is provided. The substrate 101 may be a semiconductor substrate, such as a doped or undoped silicon substrate. A buffer layer 102, a channel layer 103 and a barrier layer 104 may be formed on the upper surface 101u of the substrate 101 in sequence along the Z direction, for example, by a metal organic chemical vapor deposition (MOCVD) process or a molecular beam epitaxy (MBE) process. The buffer layer 102 may include AlN, AlGaN or GaN. For example, the buffer layer 102 may include undoped GaN or GaN that is not intentionally doped. The channel layer 103 may include AlN, GaN, InN, AlGaN, AlInN, GaInN or AlGaInN. For example, the channel layer 103 may include GaN. The barrier layer 104 may include AlN, GaN, InN, AlGaN, AlInN, GaInN or AlGaInN. For example, the barrier layer 104 may include AlGaN.

Then, a gate element 105 is formed on the upper surface 104u of the barrier layer 104. In an embodiment, the formation of the gate element 105 may include the following steps. A control layer 112 is formed on the upper surface 104u of the barrier layer 104 by a metal organic chemical vapor deposition process or a molecular beam epitaxy process. A gate metal layer 111 is formed on an upper surface 112u of the control layer 112 by a chemical vapor deposition (CVD) process or a physical vapor deposition (PVD) process. An etching process, such as a wet etching process or a dry etching process, is performed to the control layer 112 and the gate metal layer 111 so as to remove part of the control layer 112 and part of the gate metal layer 111 to form the gate element 105 shown in FIG. 2 and expose part of the upper surface 104u of the barrier layer 104. The control layer 112 may include GaN doped with p-type dopants. The gate metal layer 111 may include a conductive material, such as aluminum (Al), copper (Cu), nickel (Ni), platinum (Pt), palladium (Pd), Iridium (Ir), Molybdenum (Mo), gold (Au), titanium (Ti) or TiN.

After the formation of the gate element 105, a passivation layer 107 is formed on the barrier layer 104, for example, by a chemical vapor deposition process or a physical vapor deposition process. The passivation layer 107 may cover the exposed part of the upper surface 104u of the barrier layer 104 and the gate element 105. The passivation layer 107 may include SiN, $SiO_2$, AlN, or $Al_2O_3$.

Two holes 201 are formed on opposite sides of the gate element 105. In an embodiment, part of the channel layer 103, part of the barrier layer 104 and part of the passivation layer 107 may be removed by a photo-etching process to form the holes 201. The etching process may be performed downwardly along the Z direction. The etching process may be stopped as the etching process progresses beyond the upper surface 103u of the channel layer 103. The hole 201 may extend through the barrier layer 104 and the passivation layer 107. A bottom 201b of the hole 201 may be below the upper surface 103u of the channel layer 103. In an embodiment, a sidewall 201s of the hole 201 may be inclined with respect to the Z direction. A width of an opening of the hole 201 may be greater than that of the bottom of the hole 201.

Referring to FIGS. 3-4, source/drain elements 106 are formed in the holes 201. The formation of the source/drain element 106 may include the following steps. The hole 201 are lined with a silicon film 321. A first metal film 322 and a second metal film 323 are formed on the silicon film 321. In an embodiment, the silicon film 321, the first metal film 322 and the second metal film 323 may be formed in the hole 201 in sequence, for example, by a chemical vapor deposition process or a physical vapor deposition process. The silicon film 321 may directly contact the channel layer 103, the barrier layer 104 and the passivation layer 107. A lower surface 321b of the silicon film 321 may be below the upper surface 103u of the channel layer 103. The silicon film 321 may include a silicon-containing material with low hydrogen content, such as a silicon-containing material with a hydrogen content less than 5 at %. In an embodiment, the silicon film 321 includes amorphous silicon with a hydrogen content less than 5 at %. The first metal film 322 and the second metal film 323 may include different materials. The first metal film 322 may include metal, such as titanium, cobalt, nickel and tantalum. In an embodiment, the first metal film 322 may include titanium. The second metal film 323 may include metal, such as aluminum, copper, tungsten, titanium, nickel, molybdenum and tantalum. In an embodiment, the second metal film 323 may include aluminum or aluminum doped with copper. In an embodiment, the second metal film 323 may include aluminum or aluminum doped with copper and may be free of gold.

The formation of the source/drain element 106 may further include performing an annealing process to the structure of FIG. 3 so as to form a metal element 113, an upper silicide element 114-1 and a lower silicide element 114-2 from the silicon film 321, the first metal film 322 and the second metal film 323, as shown in FIG. 4. Specifically, during the annealing process, the silicon film 321, the first metal film 322 and the second metal film 323 react to form silicide, a portion of silicide moves upward, and another portion of silicide moves downward. The portion of silicide which moves upward can be defined as the upper silicide element 114-1. The portion of silicide which moves downward can be defined as the lower silicide element 114-2. The remainder of the second metal film 323 (or may be understood as the unreacted portion of the second metal film 323)

can be defined as the metal element 113. After the annealing process, the upper silicide element 114-1 is on an upper surface 107u of the passivation layer 107. After the annealing process, the lower silicide element 114-2 is at the bottom 201b of the hole 201. A thickness T1 of the lower silicide element 114-2 along the Z direction may be greater than a thickness T2 of the barrier layer 104 along the Z direction. An upper surface 114u of the lower silicide element 114-2 may be above an upper surface 104u of the barrier layer 104. The lower silicide element 114-2 may directly contact the channel layer 103.

The upper silicide element 114-1 and the lower silicide element 114-2 may include the same material. The upper silicide element 114-1 and the lower silicide element 114-2 may include silicide with low hydrogen content, such as silicide with a hydrogen content less than 2 at %. In an embodiment, the upper silicide element 114-1 and the lower silicide element 114-2 may include titanium silicide (TiSi) and/or titanium aluminum silicide (TiAlSi) with a hydrogen content less than 2 at %. In an embodiment, the upper silicide element 114-1 and the lower silicide element 114-2 may include titanium silicide (TiSi) and/or titanium aluminum silicide (TiAlSi) with a hydrogen content less than 1.5 at %. In an embodiment, the upper silicide element 114-1 and the lower silicide element 114-2 may have a nitrogen content less than 5 at %. In an embodiment, the upper silicide element 114-1 and the lower silicide element 114-2 may include titanium silicide (TiSi) and/or titanium aluminum silicide (TiAlSi) with a hydrogen content less than 0.6 at %.

The second metal film 323 and the metal element 113 may include the same material, such as aluminum, copper, tungsten, titanium, nickel, molybdenum and tantalum. In an embodiment, the metal element 113 may include aluminum or aluminum doped with copper. In an embodiment, the metal element 113 may include aluminum or aluminum doped with copper and may be free of gold.

In an embodiment, a semiconductor device 10 of FIG. 1 is provided through the method schematically illustrated in FIGS. 2-4.

According to the above embodiments, the source/drain element of the transistor structure of the semiconductor device provided by the present disclosure include a silicide element with low hydrogen content or low nitrogen content, and the silicide element is between the metal element and the channel layer. With such configuration, the contact resistance at the junction of the source/drain element and the channel layer effectively reduced, and the electrical performance of the semiconductor device can be improved. Moreover, the silicide element with low hydrogen content or low nitrogen content can result in better Ohmic contact.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
a channel layer;
a gate element on the channel layer;
source/drain elements at least partly embedded in the channel layer and on opposite sides of the gate element; and
a passivation layer on the channel layer,
wherein the source/drain elements comprise a metal element, a lower silicide element between the metal element and the channel layer, and an upper silicide element above the passivation layer and the lower silicide element, the lower silicide element has a hydrogen content less than 2 at %, the metal element and the lower silicide element comprise different materials, and a sidewall of the metal element between the upper silicide element and the lower silicide element contacts the passivation layer.

2. The semiconductor device according to claim 1, wherein lower silicide element is separated from the upper silicide element.

3. The semiconductor device according to claim 2, wherein the passivation layer extends to cover a first sidewall, a second sidewall opposite to the first sidewall and an upper surface connected between the first sidewall and the second sidewall of the gate element.

4. The semiconductor device according to claim 3, further comprising a barrier layer between the channel layer and the gate element, wherein the sidewall of the metal element is above the barrier layer.

5. The semiconductor device according to claim 1, further comprising a barrier layer between the channel layer and the gate element, wherein an upper surface of the lower silicide element is above an upper surface of the barrier layer.

6. The semiconductor device according to claim 1, wherein the source/drain elements comprises two upper silicide elements, the lower silicide element is below the upper silicide elements, the lower silicide element and the upper silicide elements are separated from each other.

7. The semiconductor device according to claim 6, wherein the upper silicide elements are approximately at the same level.

8. The semiconductor device according to claim 1, wherein the lower silicide element of the source/drain elements comprises titanium silicide.

9. The semiconductor device according to claim 1, wherein the lower silicide element of the source/drain elements comprises aluminum.

10. The semiconductor device according to claim 1, wherein the metal element of the source/drain elements is free of gold and comprising aluminum.

11. The semiconductor device according to claim 1, wherein the hydrogen content of the lower silicide element of the source/drain elements is less than 1.5 at %.

12. The semiconductor device according to claim 1, wherein the lower silicide element of the source/drain elements has a nitrogen content less than 5 at %.

13. The semiconductor device according to claim 1, wherein the hydrogen content of the lower silicide element of the source/drain elements is less than 0.6 at %.

14. The semiconductor device according to claim 1, further comprising a barrier layer between the channel layer and the gate element, wherein a sidewall of the barrier layer is covered by the lower silicide element.

15. The semiconductor device according to claim 14, wherein a thickness of the lower silicide element is greater than a thickness of the barrier layer.

16. The semiconductor device according to claim 14, wherein an upper surface of the lower silicide element contacting the metal element is above an upper surface of the barrier layer.

17. A semiconductor device, comprising:
a channel layer;
a gate element on the channel layer;

source/drain elements at least partly embedded in the channel layer and on opposite sides of the gate element; and a passivation layer on the channel layer, wherein the source/drain elements comprise a metal element, a lower silicide element between the metal element and the channel layer, and an upper silicide element above the passivation layer and the lower silicide element, the lower silicide element has a nitrogen content less than 5 at %, the metal element and the lower silicide element comprise different materials, and a sidewall of the metal element between the upper silicide element and the lower silicide element contacts the passivation layer.

* * * * *